United States Patent [19]
Okuda

[11] Patent Number: 5,450,432
[45] Date of Patent: Sep. 12, 1995

[54] SEMICONDUCTOR DISTRIBUTED FEEDBACK LASER EMITTING DEVICE IMPROVED IN MUTUAL MODULATION DISTORTION

[75] Inventor: Tetsuro Okuda, Tokyo, Japan

[73] Assignee: NEC Corporation, Tokyo, Japan

[21] Appl. No.: 303,940

[22] Filed: Sep. 9, 1994

[30] Foreign Application Priority Data

Sep. 10, 1993 [JP] Japan .................. 5-225420

[51] Int. Cl.⁶ .............................. H01S 3/10
[52] U.S. Cl. ........................ 372/50; 372/20; 372/96
[58] Field of Search .................. 372/96, 50, 20

[56] References Cited

U.S. PATENT DOCUMENTS

| | | | |
|---|---|---|---|
| 5,170,402 | 12/1992 | Ogita et al. | 372/20 |
| 5,187,717 | 2/1993 | Horita et al. | 372/96 |
| 5,206,877 | 4/1993 | Kahan | 372/96 |
| 5,325,382 | 6/1994 | Emura et al. | 372/26 |
| 5,325,392 | 6/1994 | Tohmori et al. | 372/96 |
| 5,355,239 | 10/1994 | Nakajima | 372/96 X |

FOREIGN PATENT DOCUMENTS

1-231388  9/1989  Japan .

Primary Examiner—James W. Davie
Attorney, Agent, or Firm—Sughrue, Mion, Zinn, Macpeak & Seas

[57] ABSTRACT

A semiconductor distributed feedback laser emitting device has upper electrodes arranged in a longitudinal direction of an oscillator for supplying current to the oscillator, and a separating electrode is provided between the upper electrodes for making the distribution of an electric field strength in the longitudinal direction uniform by changing the current density in the separating electrode with respect to the current density in the upper electrodes, thereby improving a second intermodulation distortion.

14 Claims, 12 Drawing Sheets

Fig.12

SEMICONDUCTOR DISTRIBUTED FEEDBACK LASER EMITTING DEVICE IMPROVED IN MUTUAL MODULATION DISTORTION

FIELD OF THE INVENTION

This invention relates to a semiconductor distributed feedback laser emitting device and, more particularly, to a semiconductor distributed feedback laser emitting device appropriate for an analog modulation system.

DESCRIPTION OF THE RELATED ART

An analog modulation system such as a subcarrier multiplexing transmission system requires a high-efficiency single-mode light source small in intermodulation distortion. The semiconductor distributed feedback laser emitting device is excellent in the single mode, and is appropriate for the light source. However, the semiconductor distributed feedback laser emitting device presently available is insufficient in linearity of input current-to-light output characteristics and the mutual modulation distortion, because the distribution of the electric field strength and the distribution of the carrier density lack uniformity in the direction of oscillator.

In order to improve the uniformity in the direction of oscillator, Japanese Patent Publication of Unexamined Application No. 1-231388 proposes two current sources and resistors for injecting current. The two current sources and the resistors vary the injected current depending upon the light output, and the control of the injected current lessens influences of the hole-burning effect so that the light output becomes stable.

Figure 1:
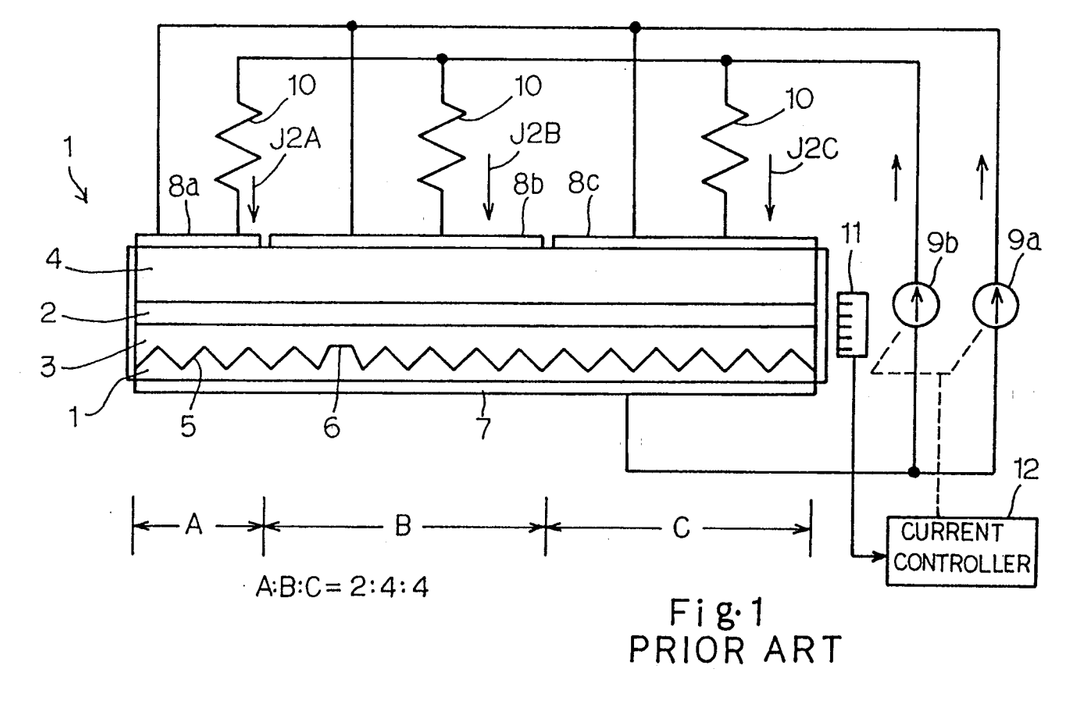
FIG. 1 is a schematic view showing the first prior art example of the semiconductor distributed feedback laser emitting device.
Figure 2:
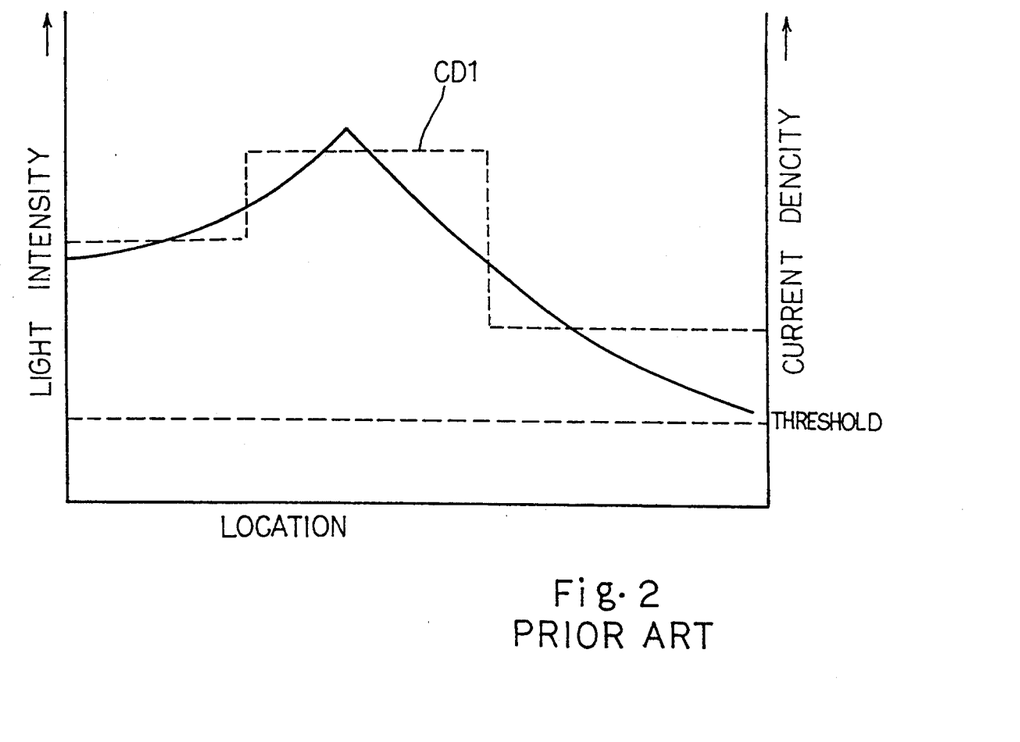
FIG. 2 is a graph showing the current density and the light intensity in terms of the location along the active structure of the prior art distributed feedback laser emitting device.

FIG. 1 illustrates the first example of the distributed feedback laser emitting device is fabricated on a semiconductor substrate 1 of n-type indium phosphide. A multi-level structure 2 is sandwiched between a waveguide layer 3 of n-type indium gallium arsenic phosphide and a clad layer 4 of p-type indium phosphide, and is implemented by an active layer of indium gallium arsenic phosphide and a buffer layer of p-type indium gallium arsenic phosphide. A diffraction grating 5 and a quarter-wavelength phase shifter 6 are provided between the semiconductor substrate 1 and the waveguide layer 3, and a high-reflective coating layer 7 covers the back surface of the semiconductor substrate 1.

A plurality of electrodes 8a, 8b and 8c are formed on an upper surface of the clad layer 4, and two current sources 9a and 9b are coupled directly and through resistors 10 to the plurality of electrodes 8a to 8c. The plurality of electrodes 8a, 8b and 8c have respective lengths A, B and C in the direction of an oscillator, and the ratio between the lengths A, B and C is regulated to 2:4:4.

Figure 3:
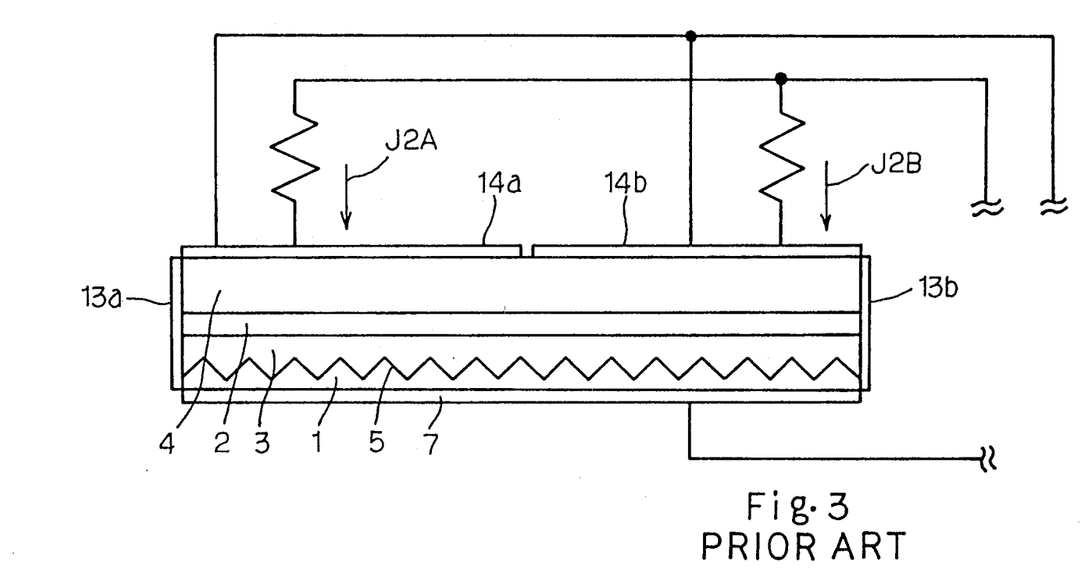
FIG. 3 is a schematic view showing the second prior art example of the semiconductor distributed feedback laser emitting device.

A photo-diode 11 is provided in the vicinity of the multi-level structure 2, and monitors the intensity of the output laser light. A current controller 12 causes the two current sources 9a and 9b to supplies currents J2A, J2B and J2C to the electrodes 8a, 8b and 8c. The currents J2A, J2B and J2C contain a threshold current density, and are regulated to a current density ratio of 2:3:1 as shown in FIG. 3. Plots CD1 indicates the relation between the current density and the location along the active structure 2 of the prior art semiconductor distributed feedback laser emitting device.

Although the injected currents J2A to J2C differ in current density by three times at the maximum in the direction of the oscillator, and second intermodulation distortion is only improved at 6dBc due to lack of uniformity in the current injection.

The second prior art example of the semiconductor distributed feedback laser emitting device is illustrated in FIG. 3 of the drawings, and is also disclosed in Japanese Patent Publication of Unexamined Application. A quarter-wavelength phase shifter is not incorporated in the second prior art example, and a low-reflective coating film 13a and a high-reflective coating film 13b respectively cover the left side surface and the right side surface. An electrode is divided into two sub-electrodes 14a and 14b, and the other layers are labeled with the same references designating corresponding layers of the first prior art example. The current injection controlling system is similar to that of the first prior art example, and injected currents J2A and J2B are regulated to a current density ration of 1:2. The second intermodulation distortion is improved at only 5dBc in spite of the large difference in the injected current density.

Thus, the prior art semiconductor distributed feedback laser emitting devices encounter a problem in the intermodulation distortion.

Another problem inherent in the prior art semiconductor distributed feedback laser emitting devices is a high production cost due to a complex current injection system.

SUMMARY OF THE INVENTION

It is therefore an important object of the present invention to provide a semiconductor distributed feedback laser emitting device which is improved in intermodulation distortion and production cost.

The present inventor contemplated the problems inherent in the prior art semiconductor distributed feedback laser emitting devices. The present inventor concluded that the poor second intermodulation distortion was resulted from non-uniform electric field strength due to improper current injection and instability of an oscillation in an analog modulation due to fluctuation of the phase conditions widely varied together with variation of the current injection density especially at the front surface on the right side thereof in FIG. 3.

To accomplish the object, the present invention proposes to decrease current density around a peak point of an electric field strength created in a semiconductor distributed feedback laser emitting device.

In accordance with one aspect of the present invention, there is provided a semiconductor distributed feedback laser emitting device fabricated on a substrate, comprising: a) a diffraction grating formed on the substrate; b) an active structure having a front end surface covered with a low-reflectivity film and a rear end surface covered with a high-reflectivity film, and extending between the front end surface and the rear end surface in a longitudinal direction of the diffraction grating for oscillating a laser light, the front end surface being spaced from the rear end surface by a first length; c) a waveguide layer formed between the diffraction grating and the active structure; d) a plurality of first electrodes electrically connected to the active structure, and spaced apart from one another over the active structure in the longitudinal direction; e) a separating electrode electrically connected to the active structure, and provided between two of the plurality of first electrodes, the separating electrode having a center line spaced apart from the front end surface by a second length ranging from a tenth to a half of the first length, the separating electrode having a third length in the longitudinal direction equal to or less than a tenth of the first length; and f) a second electrode electrically connected to the active structure, and allowing current to flow from the plurality of electrodes and the separating electrode thereto.

In accordance with another aspect of the present invention, there is provided a semiconductor distributed feedback laser emitting device fabricated on a substrate: comprising: a) a diffraction grating formed on the substrate; b) an active structure having a front end surface covered with a low-reflectivity film and a rear end surface covered with a high-reflectivity film, and extending between the front end surface and the rear end surface in a longitudinal direction of the diffraction grating for oscillating a laser light, the front end surface being spaced from the rear end surface by a first length; c) a waveguide layer formed between the diffraction grating and the active structure; d) a main electrode means electrically connected to the active structure, and extending over the active structure in the longitudinal direction; e) an auxiliary electrode means electrically connected to the active structure, and separated from the main electrode means, the auxiliary electrode having a center line spaced apart from the rear end surface by a second length equal to or less than a half of the first length, the auxiliary electrode having a third length in the longitudinal direction equal to or less than a tenth of the first length; and f) another electrode electrically connected to the active structure, and allowing current to flow from the main electrode and the auxiliary electrode thereto.

In accordance with yet another aspect of the present invention, there is provided a semiconductor distributed feedback laser emitting device fabricated on a substrate, comprising: a) a diffraction grating formed on the substrate; b) an active structure having a front end surface covered with a low-reflectivity film and a rear end surface covered with a high-reflectivity film, and extending between the front end surface and the rear end surface in a longitudinal direction of the diffraction grating for oscillating a laser light, the front end surface being spaced from the rear end surface by a first length; c) a waveguide layer formed between the diffraction grating and the active structure; d) a plurality of first electrodes electrically connected to the active structure, and spaced apart from one another over the active structure in the longitudinal direction; e) a separating electrode electrically connected to the active structure, and provided between two of the plurality of first electrodes, the separating electrode having a center line spaced apart from the front end surface by a second length ranging from a tenth to a half of the first length, the separating electrode having a third length in the longitudinal direction equal to or less than a tenth of the first length; f) an auxiliary electrode electrically connected to the active structure, and provided between the plurality of first electrodes and the rear end surface, the auxiliary electrode having a center line spaced from the rear end surface by a fourth length equal to or less than a half of the first length, the auxiliary electrode having a fifth length in the longitudinal direction, the fifth length being equal to or less than a tenth of the first length; and g) a second electrode electrically connected to the active structure, and allowing current to flow from the plurality of electrodes, the separating electrode and the auxiliary electrode thereto.

BRIEF DESCRIPTION OF THE DRAWINGS

The features and advantages of the semiconductor distributed feedback laser emitting device according to the present invention will be more clearly understood from the following description taken in conjunction with the accompanying drawings in which.

DESCRIPTION OF THE PREFERRED EMBODIMENTS

First Embodiment

Figure 4:
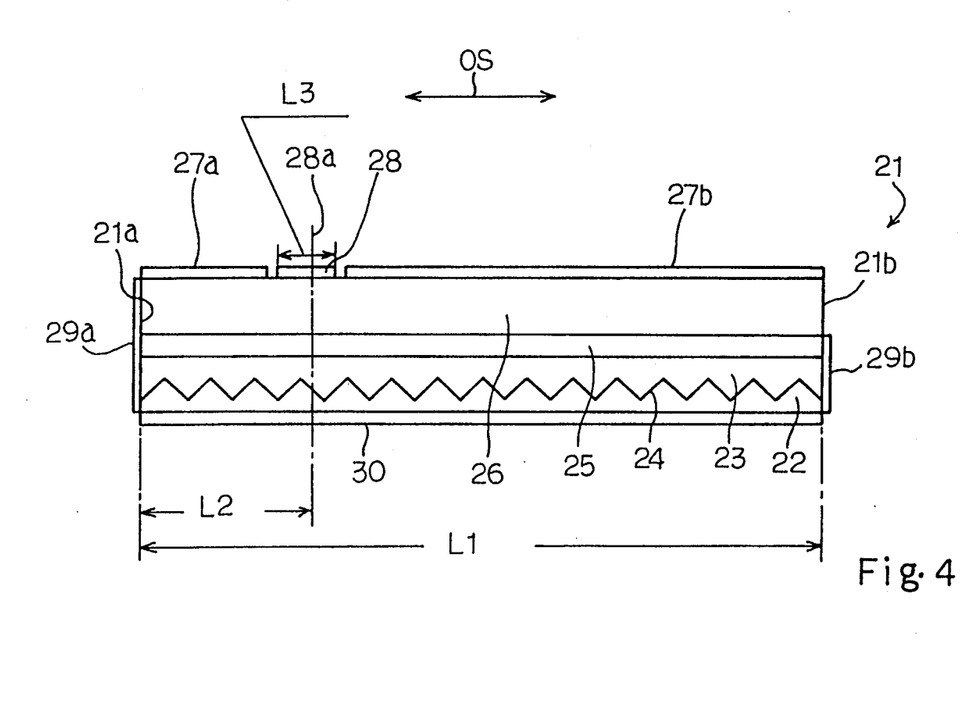
FIG. 4 is a schematic view showing a semiconductor distributed feedback laser emitting device according to the present invention.

Referring to FIG. 4 of the drawings, a semiconductor distributed feedback laser emitting device 21 embodying the present invention is fabricated on a semiconductor substrate 22 of n-type indium phosphide, and comprises a waveguide layer 23, a diffracting grating 24, an active structure 25 and a clad layer 26.

The waveguide layer 23 is formed of n-type indium gallium arsenic phosphide, and the diffraction grating 24 is sandwiched between the semiconductor substrate 22 and the waveguide layer 23. The active structure 25 is implemented by a lamination of an active layer of indium gallium arsenic phosphide and a buffer layer of p-type indium gallium arsenic phosphide, and serves as an oscillator for generating a laser light under an appropriate bias condition. The clad layer 26 is of p-type indium phosphide, and covers the active structure 25. The active structure 25 extends in the direction labeled with OS, and the direction OS is referred to as "direction of oscillator" hereinbelow.

The semiconductor distributed feedback laser emitting device has a length L1 of 300 microns in the oscillating direction. However, the length L1 may range between 150 microns to 500 microns.

The semiconductor distributed feedback laser emitting device further comprises a plurality of upper electrodes 27a and 27b, a separating electrode 28, a low-reflectivity coating film 29a, a high-reflectivity coating film 29b and a lower electrode 30.

The upper electrodes 27a and 27b are formed on the upper surface of the clad layer 26, and are spaced apart from each other. The separating electrode 28 is formed on the upper surface of the clad layer 26 between the upper electrodes 27a and 27b, and has a distance L2 between a center line 289a and a front surface 21 a of the semiconductor distributed feedback laser emitting device 21 adjusted to 75 microns in this instance. The separating electrode 28 has a length L3 of 30 microns in the direction of oscillator OS. The distance L2 can be varied without sacrifice of advantages of the present invention described hereinlater, and may range a tenth to a half of the length L1 of the semiconductor distributed feedback laser emitting device 21.

The low-reflectivity coating film 29a covers the entire front surface 21a, and the high-reflectivity coating film 29b covers a part of a ear surface 21b of the semiconductor distributed feedback laser emitting device 21. The high-reflectivity coating film 29b covers the semiconductor substrate 22, the diffraction grating 24, the waveguide layer 23 and the active structure 25 exposed to the rear surface 21b. The reflectivity of the coating film 29a is only 1 percent, and the high-reflectivity coating film 29b is 75 percent in the reflectivity. The lower electrode 30 is coated on the bottom surface of the semiconductor substrate 22.

Figure 5:
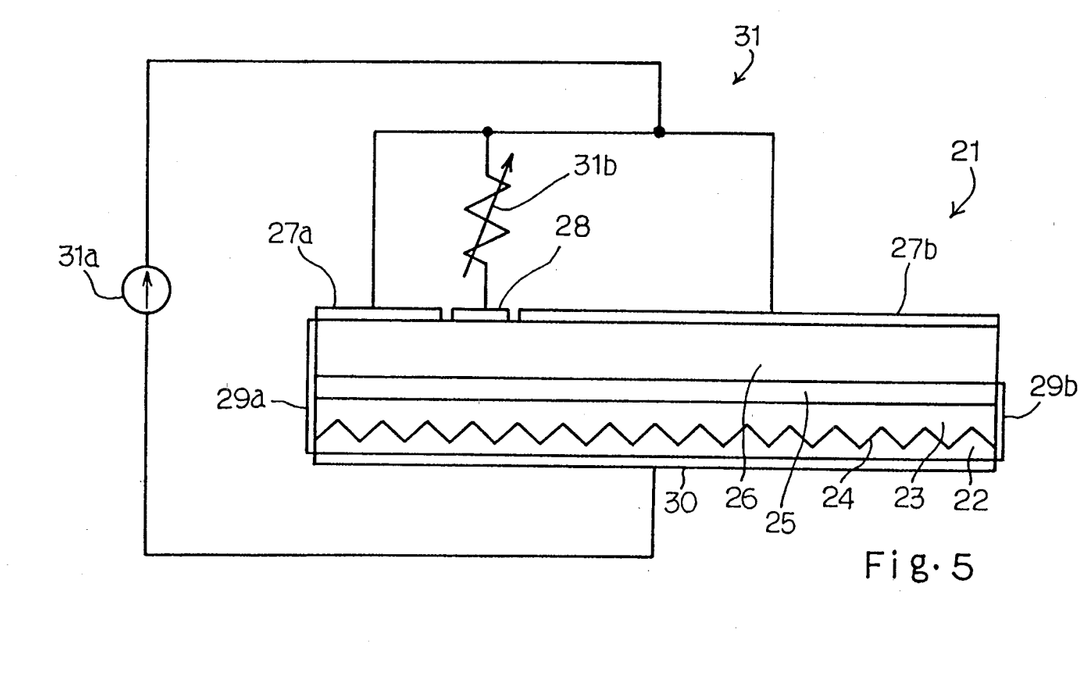
FIG. 5 is a schematic view showing a current injection system coupled to the semiconductor distributed feedback laser emitting device according to the present invention.

The present inventor fabricated various specimens of the semiconductor distributed feedback laser emitting device different in the distance L2, and the semiconductor distributed feedback laser emitting device was coupled to a current injection system 31 as shown in FIG. 5. Namely, a current source 31a was coupled between the upper electrodes 27a/27b and the lower electrode 30, and a variable resistor 31b was inserted between the current output node of the current source 31a and the separating electrode 28. The variable resistor 31a decreases the current density of electric current injected through the separating electrode 28 at 5 percent with respect to the current density of current injected into the upper electrodes 27a and 27b.

Figure 6:
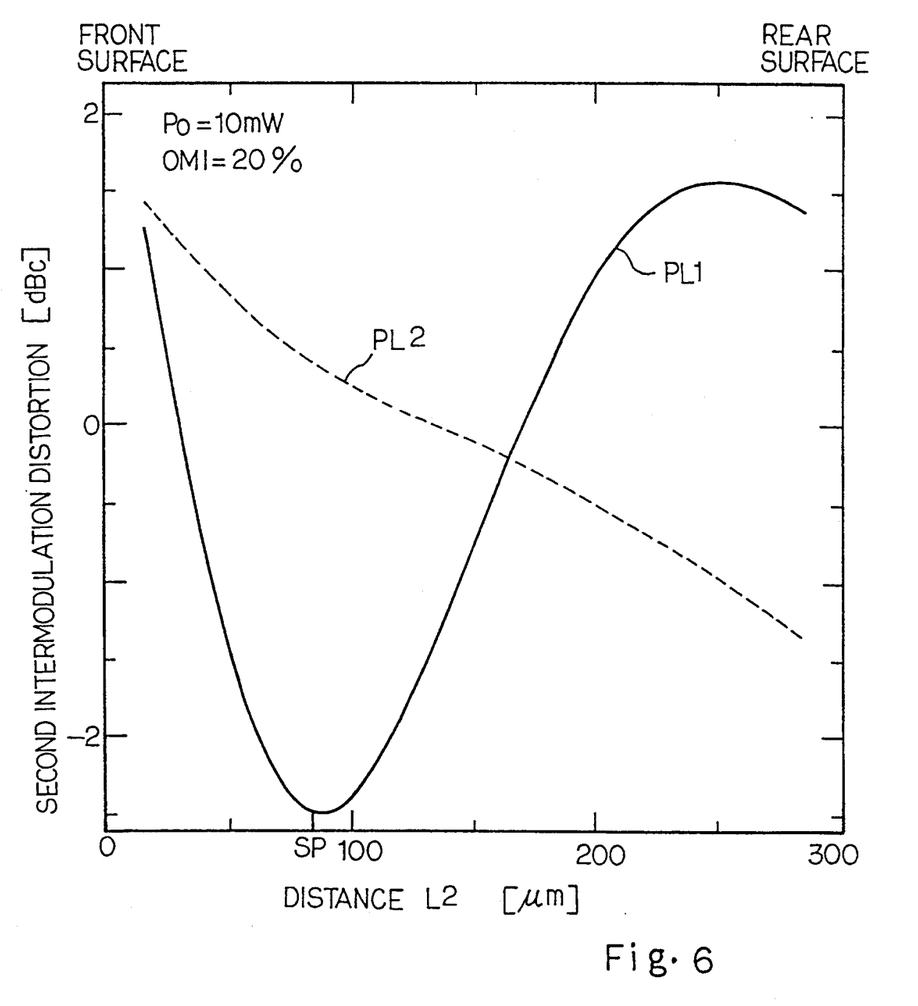
FIG. 6 is a graph showing variation of the second intermodulation distortion in terms of the location of a separating electrode of the semiconductor distributed feedback laser emitting device according to the present invention.

The semiconductor distributed feedback laser emitting device generated a laser light under the conditions where an average fiber output Po is 8 mill-watt and an optical modulation degree OMI was 20 percent, and the second intermodulation distortion was plotted in FIG. 6.

The specimens were largely broken down into two groups because of the phase characteristics of the diffracting grating 24. The first group enlarged the electric field strength around the front end portion of the oscillator, and the second group enlarged the electric field strength around the rear end portion of the oscillator. The semiconductor distributed feedback laser emitting device shown in FIG. 4 belongs to any one of the first and second groups depending upon the diffraction grating 24.

In FIG. 6, Plots PL1 stand for the first group, and the second intermodulation distortion was decreased in a range where the distance L2 fell into a tenth to a half of the length L1 from the front surface 21a. The second intermodulation distortion was minimized at 75 microns from the front surface 21a.

On the other hand, Plots PL2 stand for the second group, and the second intermodulation distortion was decreased in a range where the center line 28a fell into a half of the length L1 from the rear surface 21b. The second intermodulation distortion was minimized in the vicinity of the rear surface 21b.

In general, decrease of current injected around a peak point of the distribution of an electric field strength lowers the electric field strength, and the electric field strength is made uniform. If uniformity of an electric field strength is enhanced in the direction of oscillator OS, the semiconductor distributed feedback laser emitting device decreases the intermodulation distortion. From this aspect, it is desirable for the semiconductor distributed feedback laser emitting device to locate the separating electrode 28 as close to the peak point of the distribution of the electric field strength as possible, and the current injected into the separating electrode 28 is decreased in density. However, the first group does not achieve the minimum second intermodulation distortion at the front surface 21a as indicated by Plots PL1, and the minimum second intermodulation distortion is achieved at a spaced point SP from the front surface 21a. This is because of the fact that the injected current at the front surface 21a strongly affects the phase conditions rather than the electric field strength, and the fluctuation of the phase conditions makes the oscillation instable. Although the spaced point SP is not strictly matched with the peak point of the distribution of electric field strength, the phase conditions do not widely fluctuate, and the spaced point SP still close to the peak point enhances the uniformity of the distribution of electric field without sacrifice of the phase conditions.

Moreover, when injected current is increased, the electric field strength is increased around the injected point. Therefore, if the current density is increased around the rear surface 21b of the first group, the injected current enhances the uniformity of the distribution of electric field strength, and further decreases the intermodulation distortion of the first group.

Similarly, if the semiconductor distributed feedback laser emitting device belongs to the second group, increase of current density around the front surface 21a improves the second intermodulation distortion.

Thus, when the current density is appropriately controlled between the upper electrodes 27a and 27b and the separating electrode 28, the uniformity of the distribution of electric field strength is improved, and the semiconductor distributed feedback laser emitting device decreases the second intermodulation distortion.

Figure 7:
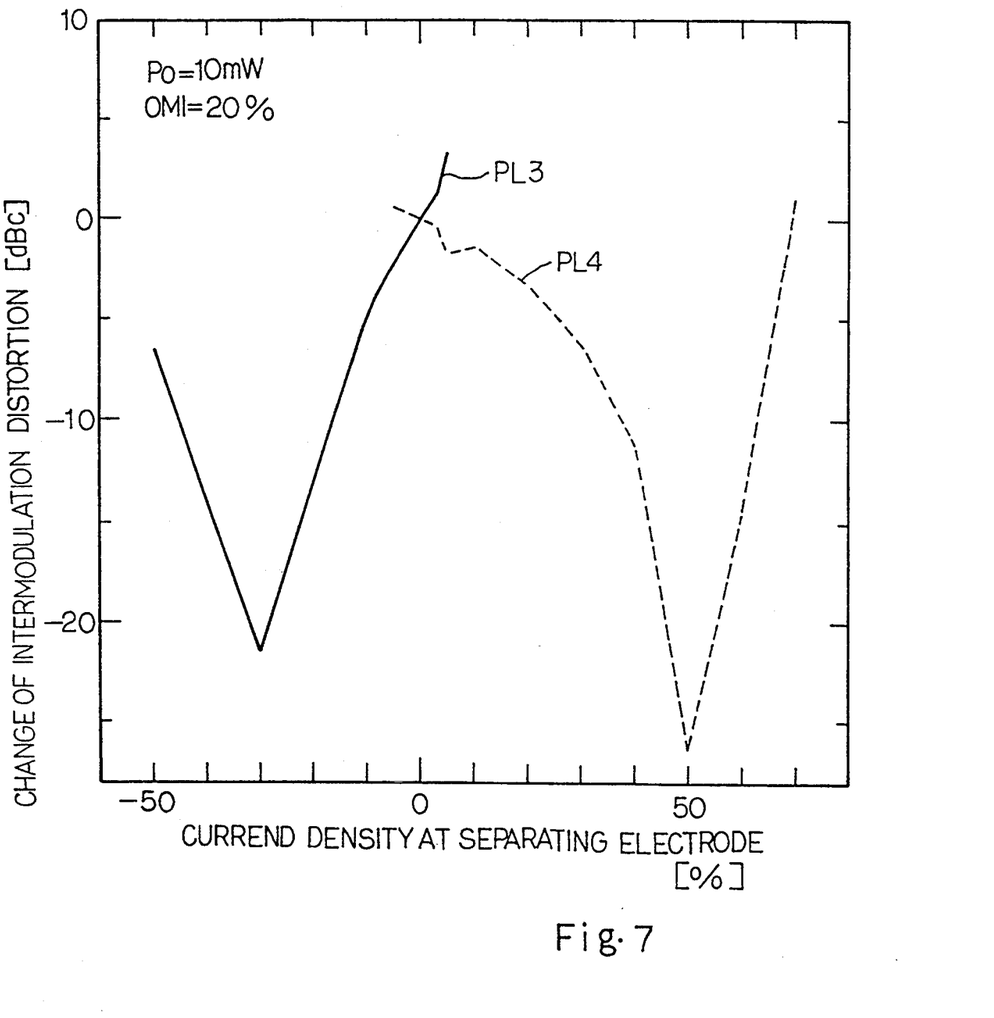
FIG. 7 is a graph showing relation between the current density in the separating electrode and the second intermodulation distortion.

The present inventor further evaluated an effective range of current density in the separating electrode 28, and the relation between the variation of current density and the second intermodulation distortion was plotted in FIG. 7. The distance L2 and the length L3 were regulated to 75 microns and 30 microns for the separating electrode 28, and the current density in the separating electrode 28 was changed with respect to the upper electrodes 27a and 27b.

Plots PL3 stand for the first group, and the second intermodulation distortion was improved between −50 per cent and 0 per cent.

Plots PL4 stand for the second group, and the second intermodulation distortion was improved between 0 percent and 70 percent.

Turning back to FIG. 5 of the drawings, when the variable resistor 31b was set to zero ohm, the current density in the separating electrode 28 was equal to the current density in the upper electrodes 27a and 27b, and measured the second intermodulation distortion though two signals. The second intermodulation distortion was −60 dBc at the average fiber output of 8 milli-watt and the optical modulation degree of 20 percent.

The present inventor sequentially changed the resistance of the variable resistor 31b, and continued the measurement under the same conditions. The second intermodulation distortion was improved to −70 dBc.

Although the influences of the distance L2 and the current density are illustrated for the semiconductor distributed feedback laser emitting device with the length L1 of 300 microns only, the present inventor confirmed the influences for the semiconductor distributed feedback laser emitting device with the length ranging from 150 microns to 500 microns. The second intermodulation distortion was improved by controlling the current density in the separating electrode 28 located within a quarter of the length L1 from the front surface 21a or around the rear surface 21b in so far as the length L1 fell into the range between 150 microns and 500 microns.

However, if the length L1 was less than 150 microns, the threshold carrier density was rapidly increased, and the distribution of the electric field strength was uncontrollable with the current density in the separating electrode 28. On the other hand, if the length L1 was greater than 500 microns, the distribution of the electric field strength along the oscillator was quite different from that of the semiconductor distributed feedback laser emitting device with the length L1 falling into the above range, and the above described controlling method is less effective against the second intermodulation distortion.

Although the length L3 of the separating electrode 28 was adjusted to a tenth of the length L1, a separating electrode less than a tenth of the length L1 will improve the second intermodulation distortion by controlling the current density in the separating electrode.

As will be appreciated from the foregoing description, the variation of the current density in the separating electrode 28 is effective against the second intermodulation distortion.

Second Embodiment

Figure 8:
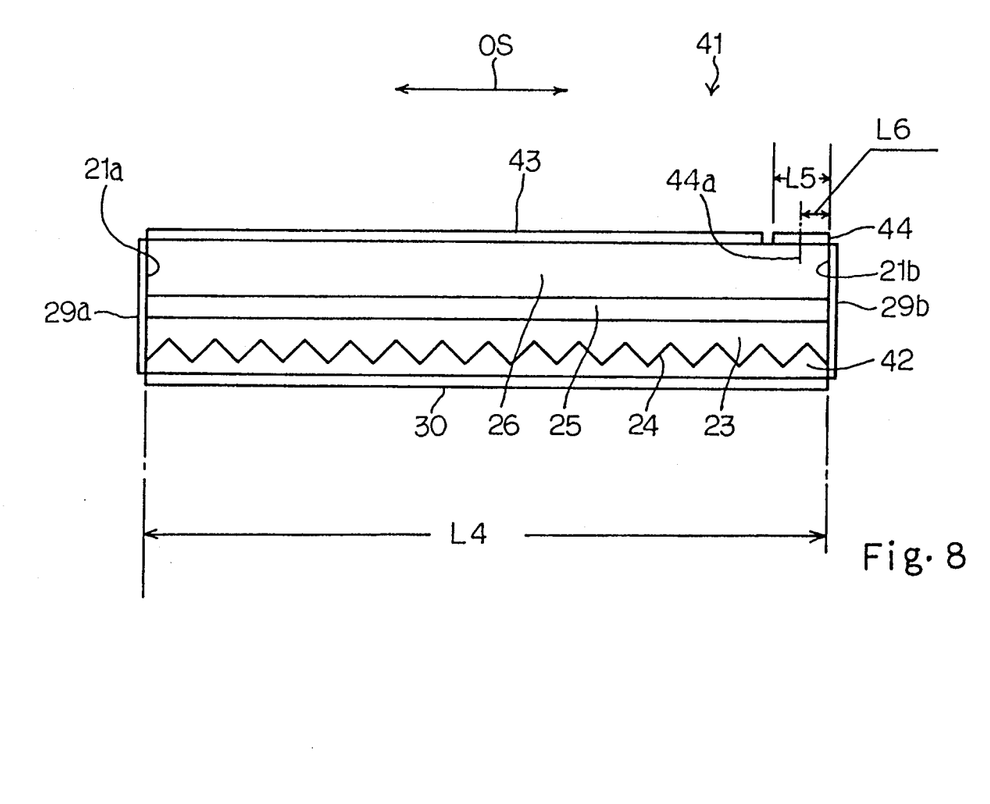
FIG. 8 is a schematic view showing another semiconductor distributed feedback laser emitting device according to the present invention.

Turning to FIG. 8 of the drawings, another semiconductor distributed feedback laser emitting 41 device embodying the present invention is fabricated on a semiconductor substrate 42. The structure of the semiconductor distributed feedback laser emitting device implementing the second embodiment is similar to that of the first embodiment except for a main electrode 43 and an auxiliary electrode 44, and, for this reason, the other layers and electrode are labeled with the same references used in FIG. 4 without detailed description.

The active structure 25 or the oscillator has a fourth length L4 of 300 microns, and the fourth length L4 may range between 150 microns and 500 microns. The auxiliary electrode 44 has a fifth length L5 of 30 microns, and the fifth length L5 is measured from the rear surface 21b in the direction of oscillator OS. The auxiliary electrode 44 may have a center line 44a spaced from the rear surface 21b by a sixth length L6 not longer a half of the fourth length L4, and the fifth length L5 may be less than a tenth of the fourth length L4.

The main electrode 43 and the auxiliary electrode 44 behave as similar to the upper electrodes 27a/27b and the separating electrode 28 in the generation of a laser light under application of an appropriate bias between the main/auxiliary electrodes 43/44 and the lower electrode 30. The current density in the auxiliary electrode 44 is varied with respect to the current density in the main electrode 43 so as to enhance the uniformity of the distribution of electric field strength in the direction of oscillator OS.

The present inventor fabricated various specimens, and confirmed that the fourth length L4, the fifth length L5 and the sixth length L6 ranging the above were effective against the second intermodulation distortion as similar to the first to third lengths L1 to L3.

The specimens of the semiconductor distributed feedback laser emitting device implementing the second embodiment are also broken down into the first group and the second group, and the first group and the second group produce a peak of the distribution of electric field strength around the front surface 21a and a peak of the distribution of electric field strength around the rear surface 21b, respectively, as described hereinbefore. The discussion on the influences on the intermodulation distortion are also valid to the second embodiment, and is not repeated hereinbelow.

Figure 9:
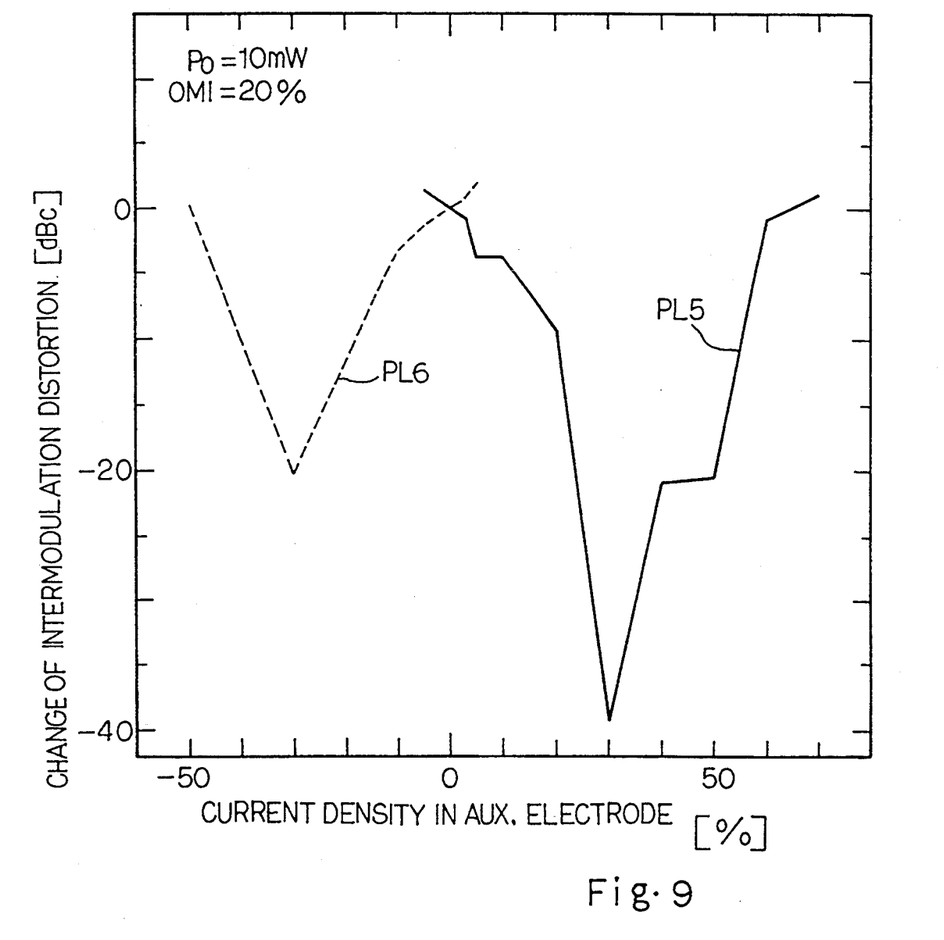
FIG. 9 is a graph showing relation between the current density in an auxiliary electrode and the second intermodulation distortion.

The present inventor evaluated the variation of current density, and the second intermodulation distortion were plotted in terms of the current density in the auxiliary electrode 44 as shown in FIG. 9. The specimens used for the evaluation had the auxiliary electrodes 44 extending from the rear surface 21b by 30 microns. The abscissa of FIG. 9 is indicative of the percentage of the current density in the auxiliary electrode 44 with respect to the main electrode 43.

Plots PL5 stand for the first group, and the current density increased to zero to 70 percent was effective against the second intermodulation distortion. Especially, when the current density in the auxiliary electrode 44 was regulated to 30 percent, the second intermodulation distortion was drastically improved at 40 dBc.

On the other hand, Plots PL6 stand for the second group, and the current density decreased to zero to 50 percent was effective against the second intermodulation distortion.

Figure 10:
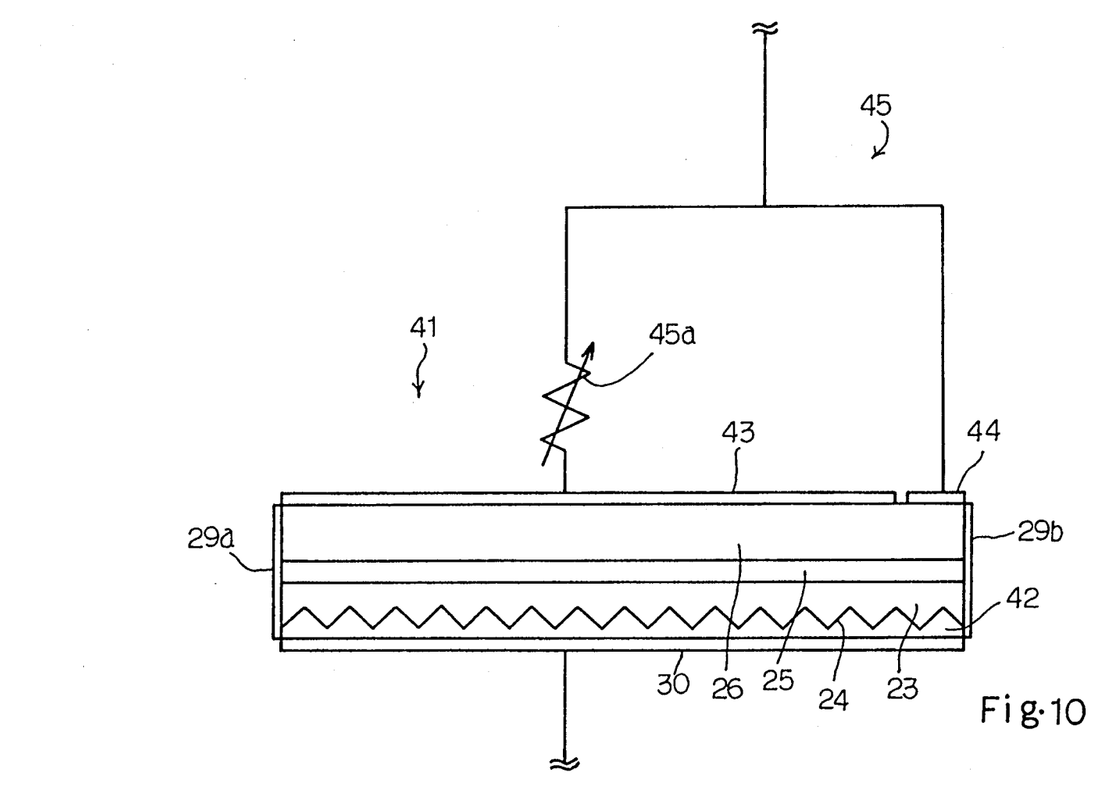
FIG. 10 is a schematic view showing a current supplying system provided for the semiconductor distributed feedback laser emitting device shown in FIG. 8.

One of the specimens with the fourth length L4 of 300 microns and the fifth length L5 of 30 microns was coupled to a current supplying system 45 shown in FIG. 10, and a variable resistor 45a was firstly regulated in such a manner that the current density in the auxiliary electrode 44 was equal to the current density in the main electrode 43. The second intermodulation distortion was measured though two signals. The second intermodulation density was −62 dBc at the average fiber output of 8 milli-watt and the optical modulation index of 20 percent.

The present inventor sequentially changed the resistance of the variable resistor 45a, and continued the measurement under the same conditions. The second intermodulation density was improved to −72 dBc.

Third Embodiment

Figure 11:
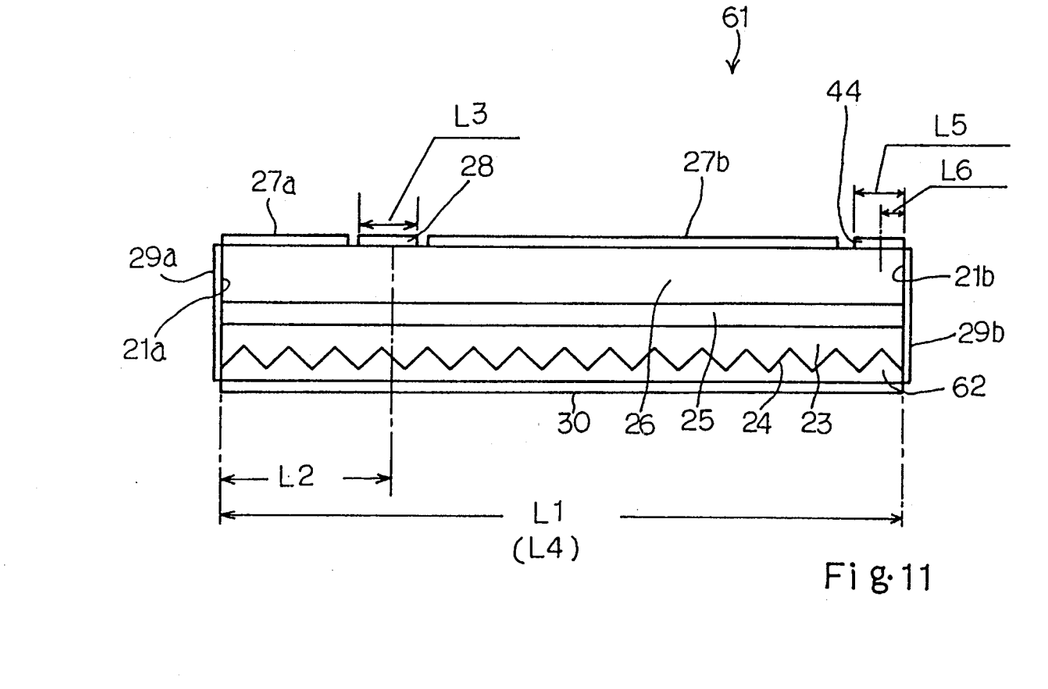
FIG. 11 is a schematic view showing yet another semiconductor distributed feedback laser emitting device according to the present invention.

Turning to FIG. 11 of the drawings, yet another semiconductor distributed feedback laser emitting device 61 is fabricated on a semiconductor substrate 62, and is a compromise between the first embodiment and the second embodiment. For this reason, the layers and the electrodes are labeled with the same references designating the corresponding layers and electrodes of the first and second embodiments without detailed description.

In this instance, the length L1 or L4, the length L2, the length L3 and the length L5 are adjusted to 300 microns, 75 microns, 30 microns and 30 microns, respectively. The discussion on the lengths L1 to L6 are valid for the semiconductor distributed feedback laser emitting device implementing the third embodiment.

The present inventor fabricated specimens of the third embodiments, and confirmed the improvement of the second intermodulation distortion.

The specimens are also broken down into the first group and the second group, and the discussion on the influences of the injected current are applicable to the third embodiment.

Figure 12:
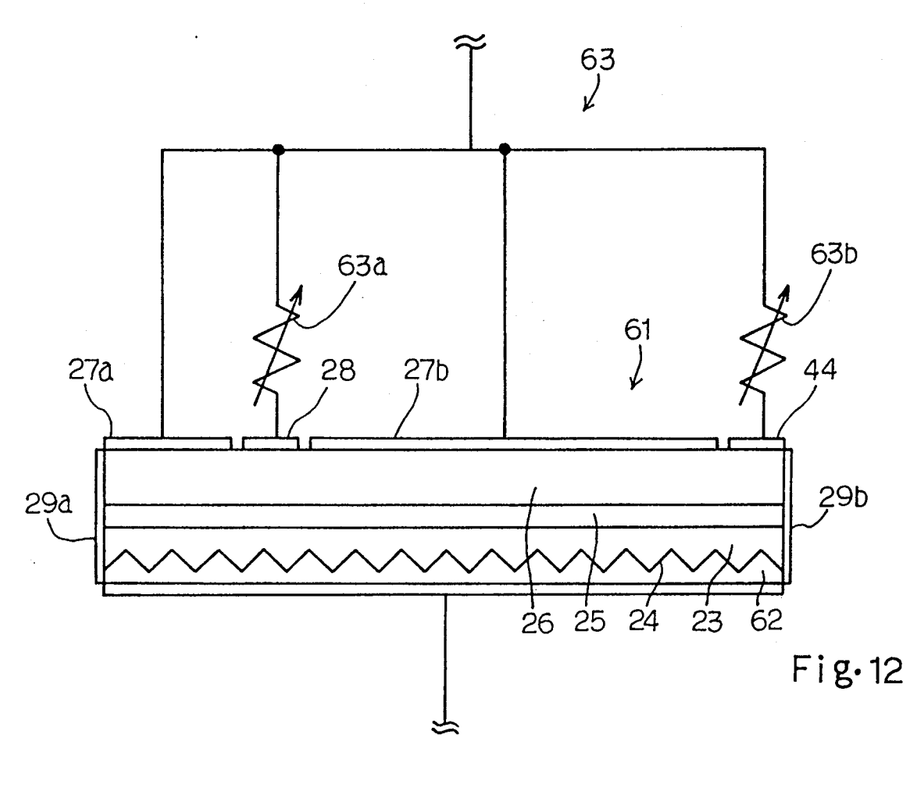
FIG. 12 is a schematic view showing a current supplying system for the semiconductor distributed feedback laser emitting device shown in FIG. 11.

The present inventor coupled a current supplying system 63 to the semiconductor distributed feedback laser emitting device with the lengths L1 to L5 described hereinbefore. When variable resistors 63a and 63b were set to zero ohm, the current density in the separating electrode 28 was equal to the current density in the upper electrodes 27a and 27b and the current density of the auxiliary electrode 44, and measured the third intermodulation distortion though two signals. The second intermodulation density was −65 dBc.

The present inventor sequentially changed the resistance of the variable resistor 63a, and continued the measurement under the same conditions. The second intermodulation density was improved to −72 dBc.

When the variable resistor 63b was changed, the improvement of the second intermodulation distortion was confirmed.

As will be understood from the foregoing description, an appropriate variation of the current density in at least one of the separating electrode and the auxiliary electrode is effective against the second intermodulation distortion, and the present inventor finds the effective range of the location of the separating/auxiliary electrode and the effective dimensions of the separating/auxiliary electrode through experiments.

Although particular embodiments of the present invention have been shown and described, it will be obvious to those skilled in the art that various changes and modifications may be made without departing from the spirit and scope of the present invention.

What is claimed is:

1. A semiconductor distributed feedback laser emitting device fabricated on a substrate, comprising:
   a) a diffraction grating formed on said substrate;
   b) an active structure having a front end surface covered with a low-reflectivity film and a rear end surface covered with a high-reflectivity film, and extending between said front end surface and said rear end surface in a longitudinal direction of said diffraction grating for oscillating a laser light, said front end surface being spaced from said rear end surface by a first length;
   c) a wave guide layer formed between said diffraction grating and said active structure;
   d) a plurality of first electrodes electrically connected to said active structure, and spaced apart from one another over said active structure in said longitudinal direction;
   e) a separating electrode electrically connected to said active structure, and provided between two of said plurality of first electrodes, said separating electrode having a center line spaced apart from said front end surface by a second length ranging from a tenth to a half of said first length, said separating electrode having a third length in said longitudinal direction equal to or less than a tenth of said first length; and
   f) a second electrode electrically connected to said active structure, and allowing current to flow from said plurality of electrodes and said separating electrode thereto.

2. The semiconductor distributed feedback laser emitting device as set forth in claim 1, in which said first length ranges from 150 microns to 500 microns.

3. The semiconductor distributed feedback laser emitting device as set forth in claim 1, in which said first length, said second length and said third length are adjusted to 300 microns, 75 microns and 30 microns, respectively.

4. The semiconductor distributed feedback laser emitting device as set forth in claim 2, in which said diffraction grating produces a peak of a distribution of electric field strength in said longitudinal direction around said front end surface, and a current density in said separating electrode is decreased at zero to 50 percent with respect to a current density in said plurality of first electrodes.

5. The semiconductor distributed feedback laser emitting device as set forth in claim 2, in which said diffraction grating produces a peak of a distribution of electric field strength in said longitudinal direction around said rear end surface, and a current density in said separating electrode is increased at zero to 70 percent with respect to a current density in said plurality of first electrodes.

6. A semiconductor distributed feedback laser emitting device fabricated on a substrate: comprising:
   a) a diffraction grating formed on said substrate;
   b) an active structure having a front end surface covered with a low-reflectivity film and a rear end surface covered with a high-reflectivity film, and extending between said front end surface and said rear end surface in a longitudinal direction of said diffraction grating for oscillating a laser light, said front end surface being spaced from said rear end surface by a first length;
   c) a wave guide layer formed between said diffraction grating and said active structure;
   d) a main electrode means electrically connected to said active structure, and extending over said active structure in said longitudinal direction;
   e) an auxiliary electrode means electrically connected to said active structure, and separated from said main electrode means, said auxiliary electrode means having a center line spaced apart from said rear end surface by a second length equal to or less than a half of said first length, said auxiliary electrode having a third length in said longitudinal direction equal to or less than a tenth of said first length; and
   f) another electrode electrically connected to said active structure, and allowing current to flow from said main electrode and said auxiliary electrode thereto.

7. The semiconductor distributed feedback laser emitting device as set forth in claim 6, in which said first length ranges from 150 microns to 500 microns.

8. The semiconductor distributed feedback laser emitting device as set forth in claim 6, in which said first length and said third length are adjusted to 300 microns and 30 microns, respectively.

9. The semiconductor distributed feedback laser emitting device as set forth in claim 7, in which said diffraction grating produces a peak of a distribution of electric field strength in said longitudinal direction around said front end surface, and a current density in said auxiliary electrode is increased at zero to 70 percent with respect to a current density in said main electrode.

10. The semiconductor distributed feedback laser emitting device as set forth in claim 7, in which said diffraction grating produces a peak of a distribution of electric field strength in said longitudinal direction around said rear end surface, and a current density in said auxiliary electrode is decreased at zero to 50 per cent with respect to a current density in said main electrode.

11. A semiconductor distributed feedback laser emitting device fabricated on a substrate, comprising:
   a) a diffraction grating formed on said substrate;
   b) an active structure having a front end surface covered with a low-reflectivity film and a rear end surface covered with a high-reflectivity film, and extending between said front end surface and said rear end surface in a longitudinal direction of said diffraction grating for oscillating a laser light, said front end surface being spaced from said rear end surface by a first length;
   c) a waveguide layer formed between said diffraction grating and said active structure;
   d) a plurality of first electrodes electrically connected to said active structure, and spaced apart from one another over said active structure in said longitudinal direction;
   e) a separating electrode electrically connected to said active structure, and provided between two of said plurality of first electrodes, said separating electrode having a center line spaced apart from said front end surface by a second length ranging from a tenth to a half of said first length, said separating electrode having a third length in said longitudinal direction equal to or less than a tenth of said first length;
   f) an auxiliary electrode electrically connected to said active structure, and provided between said plurality of first electrodes and said rear end surface, said auxiliary electrode having a center line spaced from said rear end surface by a fourth length equal to or less than a half of said first length, said auxiliary electrode having a fifth length in said longitudinal direction, said fifth length being equal to or less than a tenth of said first length; and
   g) a second electrode electrically connected to said active structure, and allowing current to flow from said plurality of electrodes, said separating electrode and said auxiliary electrode thereto.

12. The semiconductor distributed feedback laser emitting device as set forth in claim 11, in which said first length ranges from 150 microns to 500 microns.

13. The semiconductor distributed feedback laser emitting device as set forth in claim 11, in which said first length, said second length, said third length and fifth length are adjusted to 300 microns, 75 microns, 30 microns and 30 microns, respectively.

14. The semiconductor distributed feedback laser emitting device as set forth in claim 12, in which a current density in said separating electrode and a current density in said auxiliary electrode are different from a current density from said plurality of first electrodes.

* * * * *